(12) United States Patent
Aritomi

(10) Patent No.: US 6,597,624 B2
(45) Date of Patent: Jul. 22, 2003

(54) SEMICONDUCTOR MEMORY DEVICE HAVING HIERARCHICAL WORD LINE STRUCTURE

(75) Inventor: Kengo Aritomi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/139,334

(22) Filed: May 7, 2002

(65) Prior Publication Data

US 2002/0186611 A1 Dec. 12, 2002

(30) Foreign Application Priority Data

Jun. 11, 2001 (JP) .................................... 2001-175086

(51) Int. Cl.[7] ................................................ G11C 8/00
(52) U.S. Cl. .............................. 365/230.06; 365/189.11; 365/189.09
(58) Field of Search ................. 365/230.06, 189.11, 365/189.09, 230.08, 72, 177

(56) References Cited

U.S. PATENT DOCUMENTS 5,946,243 A * 8/1999 Sim ...................... 365/189.11

FOREIGN PATENT DOCUMENTS

| JP | 10-312682 | 11/1998 |
|----|-----------|---------|
| JP | 2000-21178 | 1/2000 |

* cited by examiner

Primary Examiner—David Lam
(74) Attorney, Agent, or Firm—McDermott, Will & Emery

(57) ABSTRACT

In generating sub decode signals for specifying a sub word line in a hierarchical word line structure, a first sub decode signal transmitted to a selected sub word line is generated from a sub decode first signal, and a second sub decode signal for holding a non-selected sub word line at a non-selected state is generated by a gate circuit receiving the first sub decode signal and the signal generated on the basis of the sub decode first signal. When the first sub decode signal is selected, the logic level of the second sub decode signal can be changed at high speed. Consequently, a period in which a path through which a through-current flows in a sub word driver can be made sufficiently short and accordingly, the current consumption can be reduced.

10 Claims, 8 Drawing Sheets

SEMICONDUCTOR MEMORY DEVICE HAVING HIERARCHICAL WORD LINE STRUCTURE

BACKGROUND OF THE INVENTION

1. Field of the Invention

The present invention relates to a semiconductor memory device and particularly, to a semiconductor memory device having a divided word line structure (hierarchical word line structure) that a word line is divided into a main word line and a sub word line. More particularly, the present invention relates to a configuration for driving a sub word line to a selected state.

2. Description of the Background Art

FIG. 10 is a diagram schematically showing the configuration of an array portion of a conventional semiconductor memory device. In FIG. 10, in the memory cell array portion, memory cells MC are arranged in a matrix of rows and columns. Sub word lines SWL are arranged in correspondence to rows of memory cells MC. In FIG. 10, sub word lines SWL00, SWL01, SWL10, and SWL11 are representatively shown. Although not clearly shown, memory cells MC are divided into a plurality of memory blocks along the row direction (direction in which the sub word line extends). In each memory block, sub word line SWL is arranged in correspondence to a memory cell row, and memory cells MC in the corresponding row are connected to sub word line SWL.

In each memory block, a main word line ZMWL is arranged in correspondence to a predetermined number of sub word lines. Main word line ZMWL is arranged commonly to memory blocks aligned in the row direction.

In correspondence to sub word line SWL, a sub word driver SWD is arranged. In FIG. 10, sub word drivers SWD00, SWD01, SWD10, and SWD11 arranged in correspondence to sub word lines SWL00, SWL01, SWL10, and SWL11, respectively, are shown representatively.

Each of sub word drivers SWD00, SWD01, SWD10, and SWD11 drives a corresponding sub word line to a selected state in accordance with a signal potential on main word line ZMWL and a row selection signal RSL (sub decode signals SD and ZSD). Row selection signal RSL includes complementary sub decode signals SD and ZSD and designates one sub word line in a set of sub word lines arranged, in the column direction, in correspondence to one main word line. Specifically, in the layout shown in FIG. 10, according to sub decode signals SD and ZSD, one of sub word lines SWL00 and SWL10 is designated and one of sub word lines SWL01 and SWL11 is selected.

By disposing one main word line ZMWL in correspondence to a plurality of rows of memory cells MC, pitch condition on main word lines ZMWL is relaxed. To main word line ZMWL, only sub word drivers are connected, but memory cells MC are not connected. Therefore, the load on main word line ZMWL can be reduced, and a word line can be driven to the selected state at high speed. The configuration that the word line is divided into main word line ZMWL and sub word lines SWL (generically indicating sub word lines SWL00, . . . , and SWL11) is called a divided word line structure or hierarchical word line structure.

In FIG. 10, a bit line pair BLP arranged in correspondence to a column of memory cells is shown. Bit line pair BLP includes complementary bit lines BL and /BL, and a memory cell MC is connected to one of bit lines BL and /BL.

FIG. 11 is a diagram showing the configuration of sub word driver SWD illustrated in FIG. 10. In FIG. 11, sub word driver SWD includes: a P-channel MOS transistor (insulated gate field effect transistor) Q1 which is made conductive, when the signal potential on main word line ZMWL is at the L level (ground voltage Vss level), to transmit sub decode signal SD onto sub word line SWL; an N-channel MOS transistor Q2 which is made conductive, when the signal potential on main word line ZMWL is at the H level (high voltage Vpp level), to drive sub word line SWL to a non-selected state (ground voltage Vss level); and an N-channel MOS transistor Q3 which is made conductive, when complementary sub decode signal ZSD is at the H level (array power supply voltage Vdda level), to drive sub word line SWL to a non-selected state (ground voltage Vss level).

Sub decode signal SD changes between a high voltage Vpp and a ground voltage Vss, and complementary sub decode signal ZSD changes between an array power supply voltage Vdda and ground voltage Vss. High voltage Vpp is higher than array power supply voltage Vdda. High voltage Vpp is supplied to a selected sub word line SWL by sub decode signal SD for the following reason.

As shown in FIG. 11, each memory cell MC includes a memory capacitor MQ for storing information and an access transistor MT which is made conductive, in response to the signal potential on sub word line SWL, to connect memory capacitor MQ to a corresponding bit line BL (or /BL). Access transistor MT is formed of an N-channel MOS transistor. The voltage level of H-level data transmitted to bit lines BL and /BL is the array power supply voltage Vdda level. In the case of writing H-level data to memory capacitor MQ, it is therefore necessary to prevent that the voltage level of the H-level data in memory capacitor MQ drops due to a threshold voltage loss in access transistor MT for the following reasons:

(i) At the time of reading memory cell data, a sufficiently large voltage change has to be brought about on a corresponding bit line.

(ii) A voltage applied to the main electrode (cell plate electrode) of a memory capacitor is usually an intermediate voltage between the array power supply voltage and the ground voltage, and a precharge voltage on a bit line is similarly at the intermediate voltage level. Consequently, by equaling a bit line voltage change when H-level data is read on a corresponding bit line with that when L-level data is read, a sense margin of a not-shown sense amplifier is increased.

(iii) A sufficient amount of charges is accumulated in memory capacitor MQ, to prevent the stored information from being lost due to a leak current or the like. A sense amplifier is arranged in correspondence to each bit line pair and activated to amplify the difference between voltages of bit lines in a corresponding pair.

In order to prevent the threshold voltage loss in voltage level of the H-level data, high voltage Vpp higher than array power supply voltage Vdda is supplied onto a selected sub word line SWL. Main word line ZMWL is set to the high voltage Vpp level in a non-selected state for the reason that even if sub decode signal SD at the high voltage Vpp level is applied, in sub word driver SWD, P-channel MOS transistor Q1 is set in the off state with reliability to hold the corresponding sub word line SWL in the non-selected state.

In the configuration of sub word driver SWD shown in FIG. 11, when main word line ZMWL is at the high voltage Vpp level, MOS transistor Q1 is in the off state and MOS transistor Q2 is in the on state. In this state, since MOS transistor Q1 is in the off state and MOS transistor Q2 is in the on state, irrespective of the logic level of each of sub decode signals SD and ZSD, sub word line SWL is driven to the ground voltage Vss level. Therefore, when main word line ZMWL is at the high voltage Vpp level in the non-selected state, corresponding sub word line SWL is held at the ground voltage Vss level or the non-selected state.

On the other hand, when main word line ZMWL is driven to the selected state at the ground voltage Vss level, MOS transistor Q1 is turned on or off, and MOS transistor Q2 is turned off. When sub decode signal SD is at the high voltage Vpp level, MOS transistor Q1 is turned on and sub decode signal SD at the high voltage Vpp level is transmitted to sub word line SWL.

On the other hand, when sub decode signal SD is in the non-selected state at the ground voltage Vss level, the gate and source of MOS transistor Q1 become at the same voltage level and MOS transistor Q1 is turned off. In this state, both MOS transistors Q1 and Q2 are in the off state. Sub decode signal ZSD is at the array power supply voltage Vdda level at this time, and MOS transistor Q3 is turned on to drive not-selected sub word line SWL to the ground voltage Vss level. That is; by using complementary sub decode signals SD and ZSD, sub word line SWL is prevented from entering a floating state, and a non-selected sub word line SWL is held at the ground voltage Vss level with reliability.

FIG. 12 is a diagram showing the configuration of a conventional sub decode signal generating portion. In FIG. 12, the sub decode signal generating portion includes: a sub decoder 900 for generating a sub decode first signal ZSDF in accordance with a predecode signal Z; and a sub decode signal generating circuit 910 for generating a complementary sub decode signal (row selection signal) from sub decode first signal ZSDF.

Sub decoder 900 includes: a P-channel MOS transistor 901 connected between a high voltage node receiving high voltage Vpp and a node 902, and receiving a reset signal ZRSET at a gate thereof; and an N-channel MOS transistor 903 connected between node 902 and a ground node, and receiving predecode signal X at a gate thereof. Reset signal ZRSET changes between high voltage Vpp and ground voltage Vss.

Predecode signal X changes between a peripheral power supply voltage Vddp and ground voltage Vss. Predecode signal X is generated by predecoding a predetermined bit in a row address signal. For example, in the case where two sub word lines are arranged in correspondence to one main word line as shown in FIG. 10, predecode signal X is generated by predecoding one bit of a row address signal.

Sub decode first signal ZSDF changes between high voltage Vpp and ground voltage Vss.

Sub decode signal generating circuit 910 includes: an inverter 911 for receiving sub decode first signal ZSDF and generating sub decode signal SD; an inverter 912 for receiving sub decode first signal ZSDF; and an inverter 913 for receiving an output signal of inverter 912 and generating complementary sub decode signal ZSD.

Inverter 911 receives high voltage Vpp as an operation power supply voltage, and inverters 912 and 913 receive array power supply voltage Vdda as an operation power supply voltage. Therefore, sub decode signal SD has an amplitude of the high voltage Vpp level, and complementary sub decode signal ZSD has an amplitude of the array power supply voltage Vdda level.

The operation of the sub decode signal generating portion shown in FIG. 12 will now be described briefly.

In a standby state, reset signal ZRSET is at the ground voltage Vss level, and predecode signal X is at the ground voltage Vss level. Node 902 is therefore charged to the high voltage Vpp level by MOS transistor 901 that is in the on state.

Therefore, sub decode first signal ZSDF is at the high voltage Vpp level, sub decode signal SD is at the L level of the ground voltage level, and complementary sub decode signal ZSD is at the H level of the array power supply voltage Vdda level. Consequently, in sub word driver SWD shown in FIG. 11, MOS transistor Q3 is in the on state, main word line ZMWL is at the high voltage Vpp level, and sub word line SWL is maintained at the ground voltage level.

When an active cycle of selecting a memory cell is started, reset signal ZRSET turns high voltage Vpp level, and MOS transistor 901 is turned off. When predecode signal X is in the selected state, it attains the H level of the peripheral power supply voltage Vddp level, MOS transistor 903 is turned on, and sub decode first signal ZSDF from node 902 is driven to the ground voltage Vss level. Accordingly, sub decode signal SD attains the high voltage Vpp level, and complementary sub decode signal ZSD attains the ground voltage Vss level.

On the other hand, in the non-selected state, predecode signal X is at the ground voltage level. MOS transistor 903 is in the off state, and node 902 maintains the high voltage level set in the standby state. Although not shown in FIG. 12, a P-channel MOS transistor for latching node 902 at the high voltage Vpp level in the non-selected state is arranged for node 902. In the active cycle for selecting a memory cell, therefore, output signal ZSDF of not-selected sub decoder 900 is reliably held at the high voltage Vpp level in the non-selected state.

By setting the amplitude of complementary sub decode signal ZSD at the array power supply voltage Vdda, power consumption is reduced as compared with the case of using a complementary sub decode signal having an amplitude of the high voltage Vpp level. In addition, by using stable array power supply voltage Vdda, the voltage level of complementary sub decode signal ZSD is stabilized.

FIG. 13 is a signal waveform diagram representing the operation of sub decode signal generating circuit 910 illustrated in FIG. 12. Referring to FIG. 13, the operation of sub decode signal generating circuit 910 shown in FIG. 12 will now be described.

The amplitude of an input signal (sub decode signal SD) of inverter 912 is at the high voltage Vpp level and is larger than that of an output signal of inverter 912. Consequently, an input logic threshold voltage of inverter 912 is set to be relatively high. By setting the input logic threshold voltage to be relatively high, the rising and the falling times of the output signal are made equal with respect to a change in the input signal of inverter 912.

In the standby state, sub decode first signal ZSDF is at the H level which is the high voltage Vpp level. Consequently, sub decode signal SD is at the L level which is the ground voltage level, and sub decode signal ZSD is at the H level which is the array power supply voltage level.

When a memory cycle is started, the address of a corresponding sub word line is designated, and sub decode first signal ZSDF lowers from the high voltage Vpp level to the ground voltage level at time T0, inverter 911 drives sub decode signal SD to the high voltage Vpp level at high speed. This is because CMOS transistors are used for inverter 911, and generally, the current driving power of a MOS transistor increases as the gate voltage thereof increases in absolute value.

On the other hand, in response to the falling of sub decode first signal ZSDF, inverter 912 raises its output signal to the H level at time T1. Inverter 912 uses array power supply voltage Vdda as an operation power supply voltage, and therefore, the current driving capability of inverter 912 is lower than that of inverter 911. Thus, an output signal of inverter 912 changes relatively slowly as compared with an output signal of inverter 911.

When the voltage level of the output signal of inverter 912 becomes higher than the input logic threshold voltage of inverter 913, the voltage level of complementary sub decode signal ZSD from inverter 913 drops and reaches the ground voltage level at time T2. Inverter 913 also uses the array power supply voltage as an operation power supply voltage, and therefore, output driving capability of inverter 913 is lower as compared with inverter 911, and a change of the input signal of inverter 913 is relatively slow. Consequently, complementary sub decode signal ZSD from inverter 913 changes with a certain delay from the output signal of inverter 911 and attains the ground voltage level at time T2.

As shown in FIG. 13, therefore, because of the delay time in inverter 913, during a period Ta from time T1 to time T2, both sub decode signals SD and ZSD are at the H level. When main word line ZMWL is in the selected state for the period Ta in sub word driver SWD shown in FIG. 11, as shown in FIG. 14, a through current flows via MOS transistors Q1 and Q3, and current consumption increases. Since MOS transistor Q3 is in the on state until sub decode signal ZSD becomes equal to or lower than the threshold voltage Vth, the period in which the through current flows is actually longer than period Ta.

In a normal operation mode, when high voltage Vpp is consumed by the through current and further, there is a possibility that the voltage level of high voltage Vpp drops, and accordingly the voltage level of selected sub word line SWL drops. Under such situation, data of the H level at a sufficient voltage level could not be written to a memory cell. In addition. H-level data stored in a memory cell could not be read out onto the corresponding bit line at high speed. Consequently, the memory cell data could not be sensed and amplified accurately by a not-shown sense amplifier, so that an accurate memory operation cannot be guaranteed.

Particularly, in an accelerated test mode such as wafer burn-in test, all the word lines (sub word lines) or half of sub word lines, that is, sub word lines of odd-number or even-number addresses are simultaneously selected. In the case that a plurality of sub word lines are simultaneously selected, sub word lines greater in number than those in the normal operation mode are selected, charges supplied from the high voltage generating circuit are consumed more, and the degree of drop of high voltage Vpp becomes greater. This is because the number of selected sub word lines increases and the number of paths of the through current increases. In the case where all of charges supplied from the high voltage generating circuit or more are consumed due to such a through current, the voltage level of high voltage Vpp is kept at the dropped level, a high voltage at an intended level cannot be applied to selected word lines (main and sub word lines), a voltage stress cannot be applied accurately. Consequently, such a problem arises that the reliability of a product (chip) cannot be assured even if a burn-in test is carried out.

SUMMARY OF THE INVENTION

An object of the invention is to provide a semiconductor memory device in which a through current is not caused in a sub word driver in selecting a word line.

Another object of the invention is to provide a semiconductor memory device capable of driving a selected sub word line to a predetermined voltage level at high speed with accuracy.

Further object of the invention is to provide a semiconductor memory device with reduced power consumption.

A semiconductor memory device according to a first aspect of the invention includes: a first decoding circuit for generating a sub decode first signal for specifying one of sub word lines arranged in correspondence to a main word line in accordance with an address signal; a first driving circuit receiving a first voltage as an operation power supply voltage and generating a first sub decode signal in accordance with the sub decode first signal; a second driving circuit receiving a second voltage as an operation power supply voltage and generating an internal sub decode signal in accordance with the sub decode first signal; and a gate circuit receiving the second voltage as an operation power supply voltage and generating a second sub decode signal complementary to the first sub decode signal in accordance with output signals of the first and second driving circuits. One sub word line is designated in accordance with a set of the first and second sub decode signals.

A semiconductor memory device according to a second aspect of the invention includes: a plurality of memory cells arranged in rows and columns; a plurality of sub word lines arranged in correspondence to the memory cell rows and each having memory cells of a corresponding row connected; a plurality of main word lines each arranged in correspondence to a predetermined number of sub word lines; a main word line selecting circuit for driving one of the plurality of main word lines to a selected state in accordance with a first address signal; a sub decode circuit for generating a sub decode first signal for selecting one of the predetermined number of sub word lines in accordance with a second address signal; and a sub decode driving circuit for generating a pair of complementary sub decode signals in accordance with the sub decode first signal. The sub decode driving circuit includes: a first driving circuit receiving a first voltage as an operation power supply voltage and generating a first sub decode signal in accordance with the sub decode first signal; a second driving circuit receiving a second voltage as an operation power supply voltage and generating an internal sub decode signal in accordance with the sub decode first signal; and a gate circuit receiving the second voltage as an operation power supply voltage and generating a second sub decode signal complementary to the first sub decode signal in accordance with output signals of the first and second driving circuit. One of the predetermined number of sub word lines is designated in accordance with the first and second sub decode signals The semiconductor memory device according to the second aspect of the invention further includes a sub word driver arranged in correspondence to the respective sub word lines, for driving a corresponding sub word line to a selected state in accordance with a signal on a corresponding main word line and a pair of complementary sub decode signals from the sub decode driving circuit.

By generating the second sub decode signals in accordance with output signals of the first and second driving circuits, the second sub decode signal can be changed at high speed in response to a change in the first sub decode signal. The period in which both complementary first and second sub decode signals are in the state where a through current flows in a corresponding sub word driver can be shortened, and accordingly current consumption can be reduced. In addition, a signal at a predetermined voltage level can be transmitted to a selected sub word line with reliability, and the selected sub word line can be reliably driven to the selected state at the predetermined voltage level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
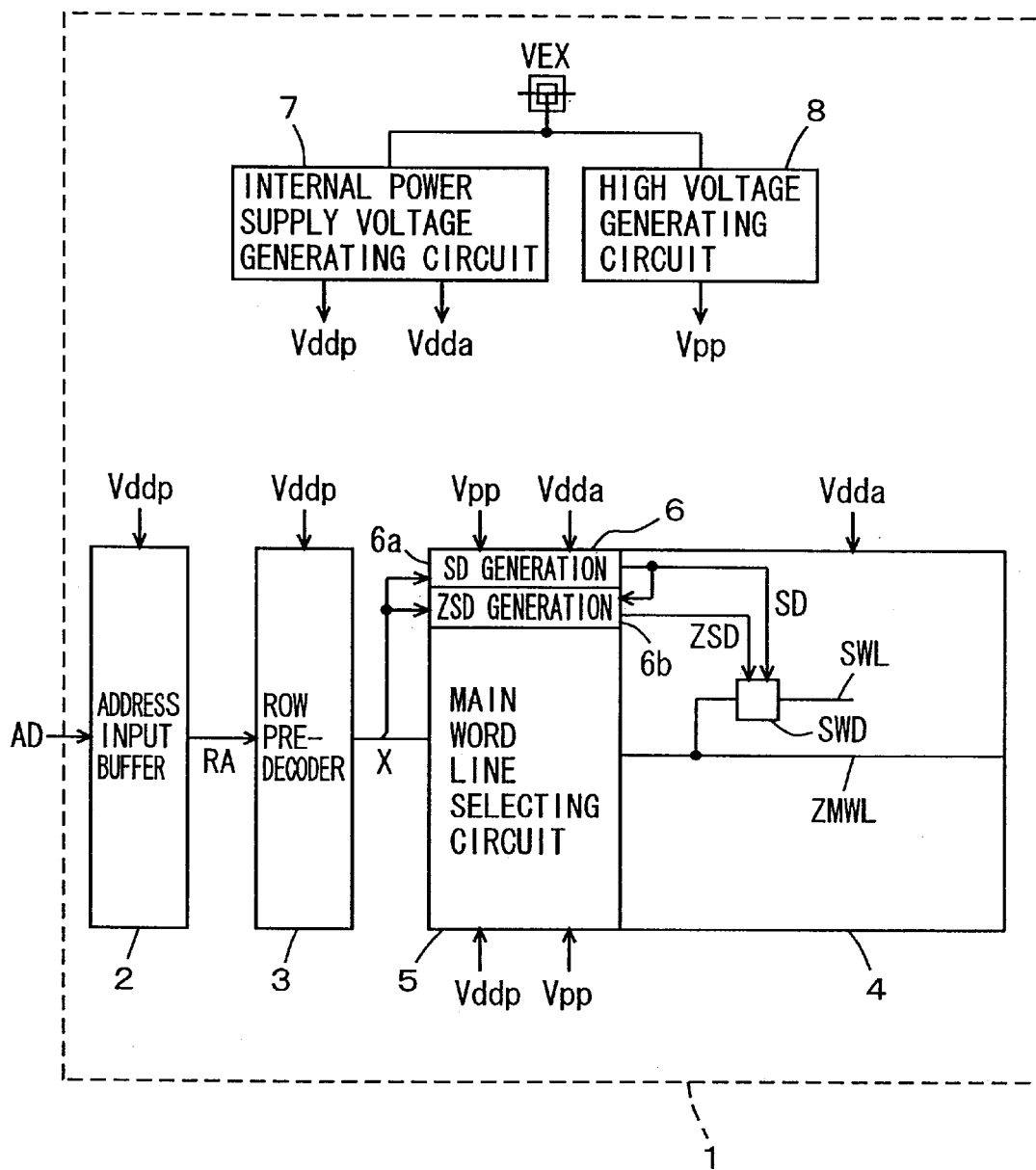
FIG. 1 is a diagram schematically showing the configuration of a main portion of a semiconductor memory device according to a first embodiment of the invention.

FIG. 1 is a diagram schematically showing the configuration of a portion related to row selection of a semiconductor memory device according to a first embodiment of the invention. In FIG. 1, a semiconductor memory device 1 includes: an address input buffer 2 for receiving an external address signal AD and generating an internal row address signal RA; a row predecoder 3 for predecoding internal row address signal RA from address input buffer 2 and generating a row predecode signal X; and a memory cell array 4.

In memory cell array 4, a plurality of memory cells are arranged in rows and columns. The memory cells are not shown for simplicity of the drawing.

In memory cell array 4, sub word lines SWL each arranged in correspondence to a row of memory cells and having memory cells of a corresponding row connected, and a main word line ZMWL provided in correspondence to a predetermined number of sub word lines are arranged. Memory cell array 4 is divided into a plurality of memory blocks along the row direction. In a sub word driver band in an area between memory blocks or an area outside of the memory blocks, sub word drivers SWD are arranged in correspondence to sub word lines SWL. In FIG. 1, however, the block divided structure of the memory cell array is not shown for simplicity of the drawing.

Semiconductor memory device 1 further includes: a main word line selecting circuit 5 for decoding a predetermined signal of predecode signal X from row predecoder 3 and driving an addressed main word line to a selected state; and a sub word line selection signal generating circuit 6 for decoding a predetermined predecode signal from row predecoder 3 and generating complementary sub decode signals SD and ZSD.

Sub word line selection signal generating circuit 6 includes an SD generating circuit 6a for generating sub decode signal SD and a ZSD generating circuit 6b for generating complementary sub decode signal ZSD. A pair of sub decode signals SD and ZSD from sub word line selection signal generating circuit 6 is supplied to sub word driver SWD provided in correspondence to sub word line SWL. The pair of sub decode signals SD and ZSD is generated in correspondence to respective sub word lines arranged for one main word line (this configuration will be described in detail later).

Semiconductor memory device 1 further includes an internal power supply voltage generating circuit 7 for generating array power supply voltage Vdda and peripheral power supply voltage Vddp from an external power supply voltage VEX, and a high voltage generating circuit 8 for generating high voltage Vpp from external power supply voltage VEX. Internal power supply voltage generating circuit 7 includes an array power supply voltage generating circuit for down converting external power supply voltage VEX and generating array power supply voltage Vdda, and a peripheral power supply voltage generating circuit for down converting external power supply voltage VEX and generating peripheral power supply voltage Vddp. High voltage generating circuit 8 includes a charge pump circuit for generating high voltage Vpp through the charge pumping operation of a capacitor.

Peripheral power supply voltage Vddp is supplied as one operation power supply voltage to address input buffer 2 and row predecoder 3 constructing a peripheral circuit. To main word line selecting circuit 5, peripheral power supply voltage Vddp and high voltage Vpp are applied. To sub word line selection signal generating circuit 6, high voltage Vpp and array power supply voltage Vdda are applied. To memory cell array 4, array power supply voltage Vdda is applied as an operation power supply voltage of not-shown sense amplifier circuits.

In sub word line selection signal generating circuit 6, high voltage Vpp is applied to SD generating circuit 6a for generating sub decode signal SD, and array power supply voltage Vdda is applied to ZSD generating circuit 6b for generating sub decode signal ZSD. ZSD generating circuit 6b generates a complementary sub decode signal ZSD in accordance with an internal signal generated according to a predecode signal from row predecoder 3 and sub decode signal SD.

When sub decode signal SD of the amplitude of high voltage Vpp level is driven to the H level of the selection state, in ZSD generating circuit 6b, complementary sub decode signal ZSD is driven to the ground voltage level at high speed, the period in which both complementary sub decode signals SD and ZSD are both at the H level is shortened and accordingly, a through current in a selected sub word driver is reduced.

Figure 2:
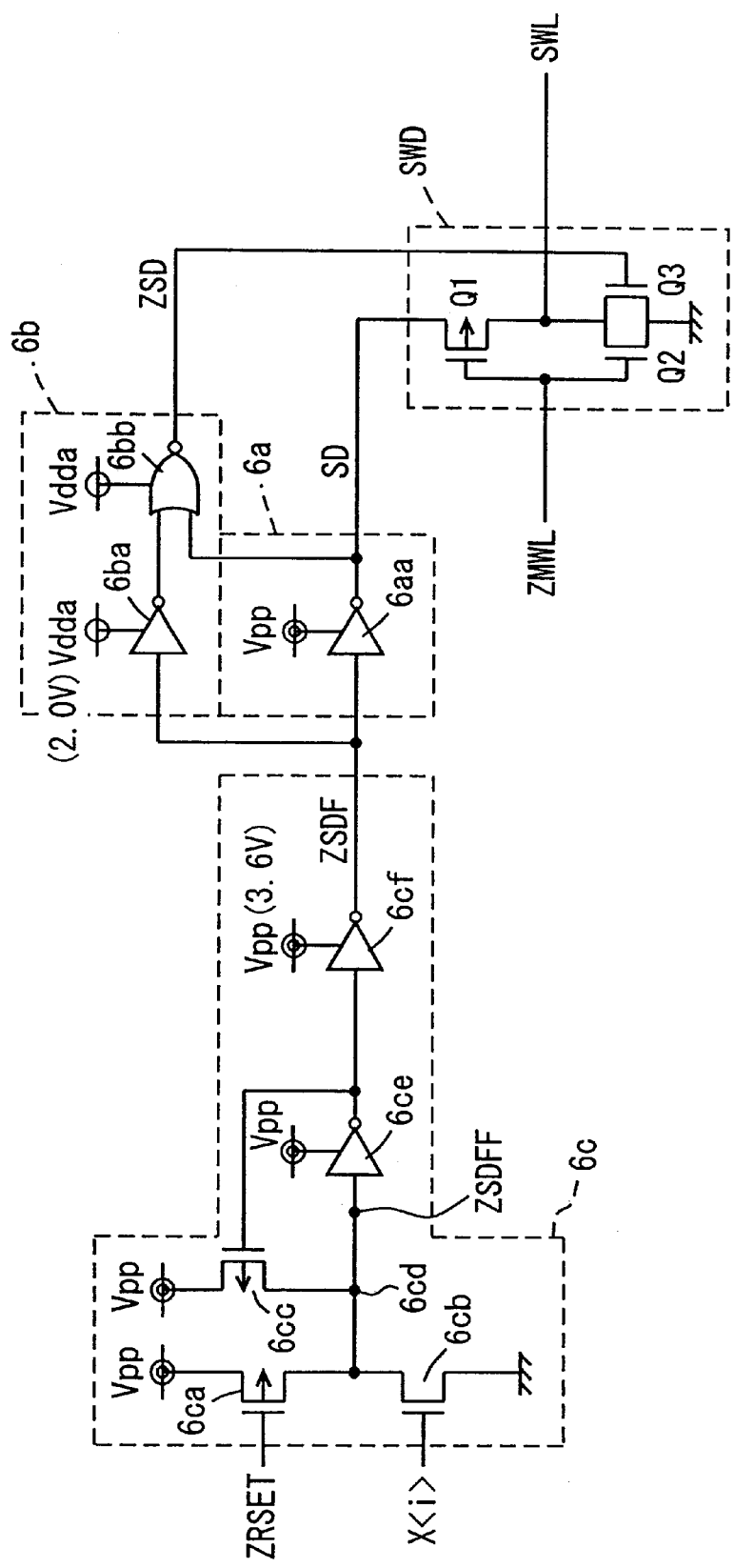
FIG. 2 is a diagram showing an example of the configuration of a sub word line selection signal generating circuit illustrated in FIG. 1.
Figure 6:
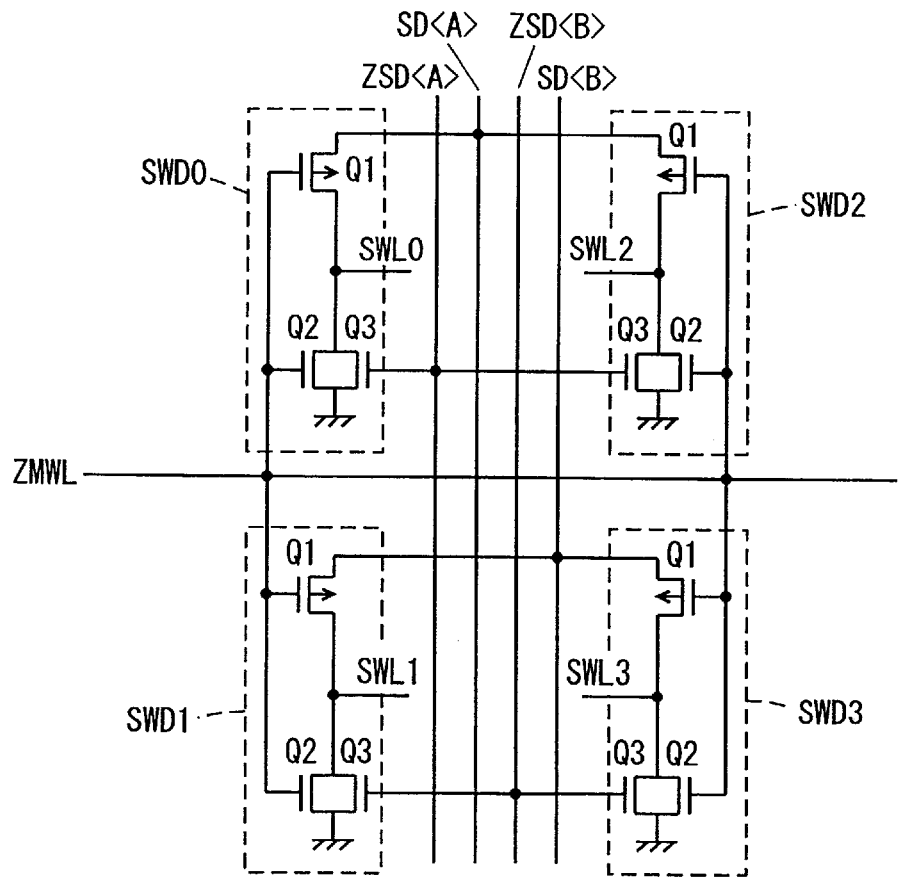
FIG. 6 is a diagram showing the layout of sub word drivers of a sub word driver band illustrated in FIG. 5.

FIG. 2 is a diagram showing an example of the configuration of sub word line selection signal generating circuit 6 illustrated in FIG. 1. In FIG. 6, in sub word line selection signal generating circuit 6, a sub decoder 6c for generating a sub decode first signal ZSDF in accordance with a predecode signal X<i> is provided commonly to SD generating circuit 6a for generating sub decode signal SD and ZSD generating circuit 6b for generating complementary sub decode signal ZSD.

Sub decoder 6c includes: a P-channel MOS transistor 6ca connected between a high voltage node receiving high voltage Vpp and a node 6cd, and receiving reset signal ZRSET at a gate thereof; an N-channel MOS transistor 6cb connected between node 6cd and a ground node, and receiving predecode signal X<i> at a gate thereof; an inverter 6ce for receiving a signal ZSDFF at node 6cd; a P-channel MOS transistor 6cc for electrically connecting the high voltage node to node 6cd in accordance with an output signal of inverter 6ce; and an inverter 6cf for inverting an output signal of inverter 6ce to generate sub decode first signal ZSDF.

Each of inverters 6ce and 6cf receives high voltage Vpp of, for example, 3.6V as an operation power supply voltage. P-channel MOS transistor 6cc is made conductive to hold node 6cd at the high voltage Vpp level when decode signal ZSDFF is at the high voltage Vpp level.

SD generating circuit 6a includes an inverter 6aa receiving high voltage Vpp as an operation power supply voltage and inverting sub decode first signal ZSDF to generate sub decode signal SD.

ZSD generating circuit 6b includes: an inverter 6ba receiving sub decode first signal ZSDF; and an NOR circuit 6bb receiving an output signal of inverter 6ba and sub decode signal SD and generating complementary sub decode signal ZSD. To inverter 6ba and NOR circuit 6bb, array power supply voltage Vdda of, for example, 2.0V is applied as an operation power supply voltage.

Each of inverters 6ce, 6cf, 6aa, and 6ba is constructed by CMOS transistors, and NOR circuit 6bb has also a CMOS configuration. Therefore, the operation speed of each of the inverters and NOR circuit is determined according to the amplitude of a voltage applied to the gate of a MOS transistor of a component thereof.

Figure 3:
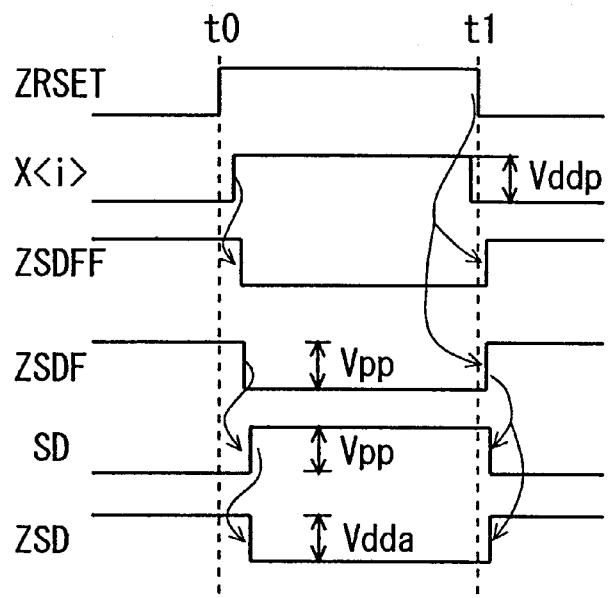
FIG. 3 is a signal waveform diagram representing the operation of the circuit illustrated in FIG. 2.
Figure 11:
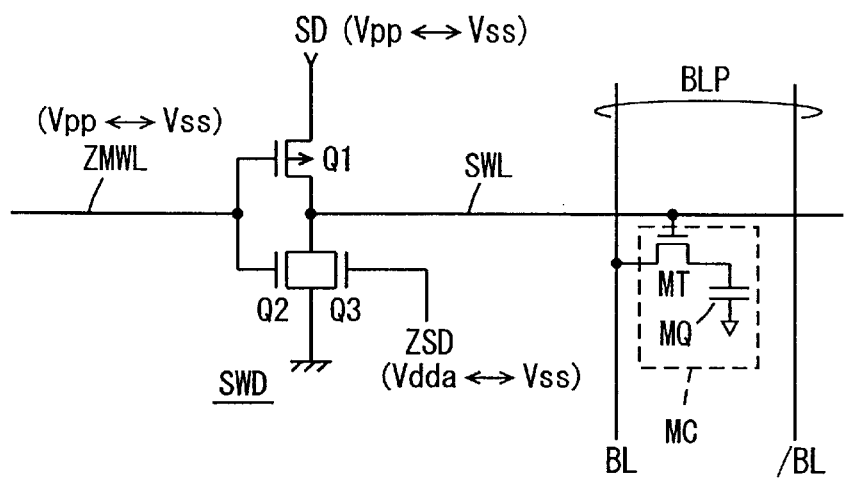
FIG. 11 is a diagram showing the configuration of a sub word driver and a memory cell illustrated in FIG. 10.
Figure 12:
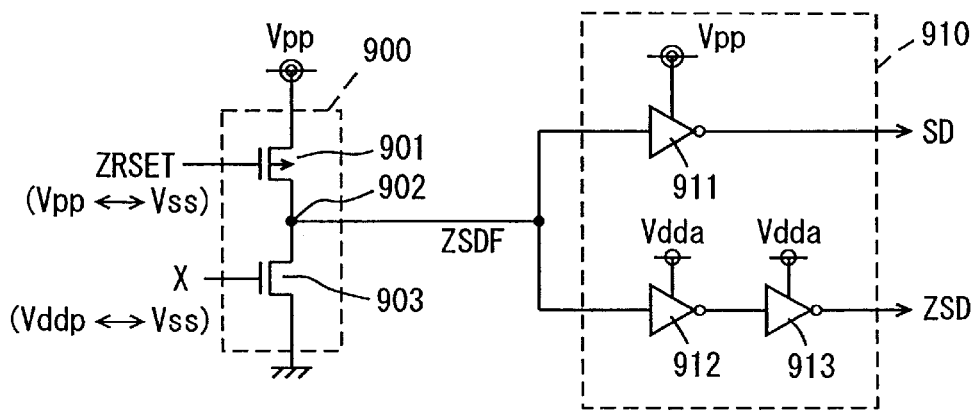
FIG. 12 is a diagram showing the configuration of a conventional sub decode signal generating portion.
Figure 13:
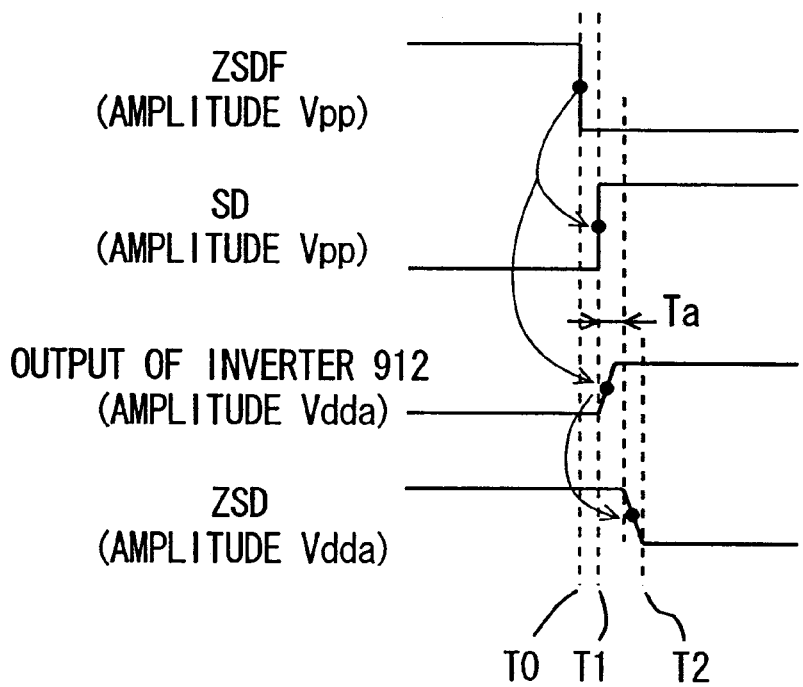
FIG. 13 is a signal waveform diagram representing the operation of the sub decode signal generating circuit illustrated in FIG. 12.
Figure 14:
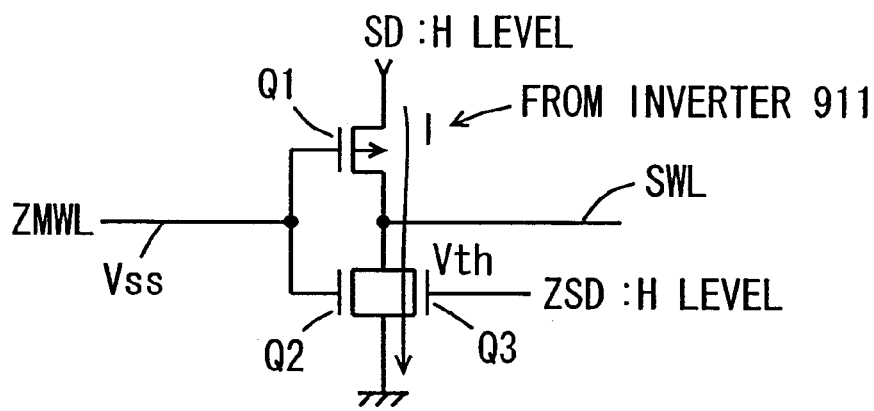
FIG. 14 is a diagram for explaining a problem of the conventional semiconductor memory device.

Sub word driver SWD has a configuration similar to that shown in FIG. 11 and includes: a P-channel MOS transistor Q1 which is selectively made conductive, when the signal potential on main word line ZMWL is at the ground voltage level, to transmit sub decode signal SD at the high voltage level to sub word line SWL; an N-channel MOS transistor Q2 which is made conductive, when the signal potential on main word line ZMWL is at the high voltage Vpp level, to discharge sub word line SWL to the ground voltage level; and an N-channel MOS transistor Q3 which is made conductive, when complementary sub decode signal ZSD is at the array power supply voltage level, to discharge sub word line SWL to the ground voltage level. The operation of the sub word line selection signal generating circuit shown in FIG. 2 will now be described briefly with reference to the signal waveform diagram of FIG. 3.

When an active cycle of selecting a memory cell starts, first, at time t0, reset signal ZRSET goes high (high voltage Vpp level). Responsively, in sub decoder 6c, P-channel MOS transistor 6ca is turned off.

When row predecode signal X<i> from row predecoder 3 shown in FIG. 1 turns selected state at the H level, MOS transistor 6cd is turned on, and node 6cd is discharged to the ground voltage level. Accordingly, an output signal of inverter 6ce attains the high voltage Vpp level, MOS transistor 6cc is turned off, and node 6cd is discharged to the ground voltage level with reliability. In response to the rising of an output signal of inverter 6ce, sub decode first signal ZSDF from inverter 6cf falls from the high voltage Vpp level to the ground voltage level.

When sub decode first signal ZSDF goes low, sub decode signal SD is driven to the high voltage Vpp level at high speed by inverter 6aa receiving high voltage Vpp as an operation power supply voltage. When sub decode signal SD is driven to the high voltage Vpp level, in ZSD generating circuit 6b, NOR circuit 6bb drives complementary sub decode signal ZSD to the ground voltage level at high speed in accordance with sub decode signal SD at the high voltage Vpp level.

Consequently, by applying sub decode signal SD at the high voltage Vpp level to NOR circuit 6bb in ZSD generating circuit 6b and driving complementary sub decode signal ZSD to the L level in accordance with sub decode signal SD at the high voltage Vpp level, sub decode signal SD can be driven to the L level at high speed. Accordingly, the period in which both sub decode signals SD and ZSD are at the H level can be made sufficiently short. In sub word driver SWD, therefore, it can be suppressed that both MOS transistors Q1 and Q3 are turned on and a through current flows from the high voltage node of inverter 6aa to the ground node via MOS transistors Q1 and Q3.

In other words, as compared with the configuration of generating complementary sub decode signal ZSD by using two stages of the inverters receiving array power supply voltage Vdda as an operation power supply voltage, by applying sub decode signal SD at the high voltage level to NOR circuit 6bb, one stage of the inverter can be bypassed, and an output signal of NOR circuit 6bb can be discharged at high speed. Therefore, delay time can be reduced, and complementary sub decode signal ZSD can be changed at higher speed.

In sub word driver SWD, when corresponding main word line ZMWL is in the selected state (ground voltage level), sub decode signal SD at the high voltage Vpp level is transmitted to sub word line SWL via MOS transistor Q1. At this time, MOS transistor Q3 is turned on in accordance with complementary sub decode signal ZSD. On the other hand, when main word line ZMWL is in the non-selected state (high voltage level), MOS transistor Q1 is in the off state, and sub word line SWL is held at the ground voltage level by MOS transistor Q2.

After the memory cell selecting cycle is completed and the operation of accessing the semiconductor memory device is completed, at time t1, reset signal ZRSET goes low, MOS transistor 6ca is turned on, and node 6cd is charged to the high voltage Vpp level. Before reset signal ZRSET goes low, predecode signal X<i> has already fallen to the L level, so that a through current is prevented from flowing in sub decoder 6c.

In accordance with the activation of reset signal ZRSET, decode signal ZSDFF rises to the high voltage Vpp level, sub decode first signal ZSDF is driven to the high voltage Vpp level, sub decode signal ZSD is driven to the array power supply voltage Vdda level, and sub decode signal SD is driven to the ground voltage level. NOR circuit 6bb drives an output signal (complementary sub decode signal) ZSD to the H level when receives L-level signals at respective inputs. Consequently, complementary sub decode signal ZSD is driven to the array power supply voltage Vdda level in response to the rising of sub decode signal ZSDF. Even if complementary sub decode signal ZSD changes relatively gently upon completion of the memory cycle, sub decode signal SD is driven to the ground voltage level at high speed, to cut off a path of flowing a through current, and therefore, no through current flows upon returning to the standby state.

MOS transistor 6cc is provided for the following reason. When predecode signal X<i> is in the non-selected state and MOS transistor 6cb is in the off state, an output signal of inverter 6c is at the L level, and MOS transistor 6cc is in the on state to charge node 6cd to the Vpp level. It is prevented that node 6cd enters a floating state when predecode signal X<i> is in the non-selected state.

Figure 4:
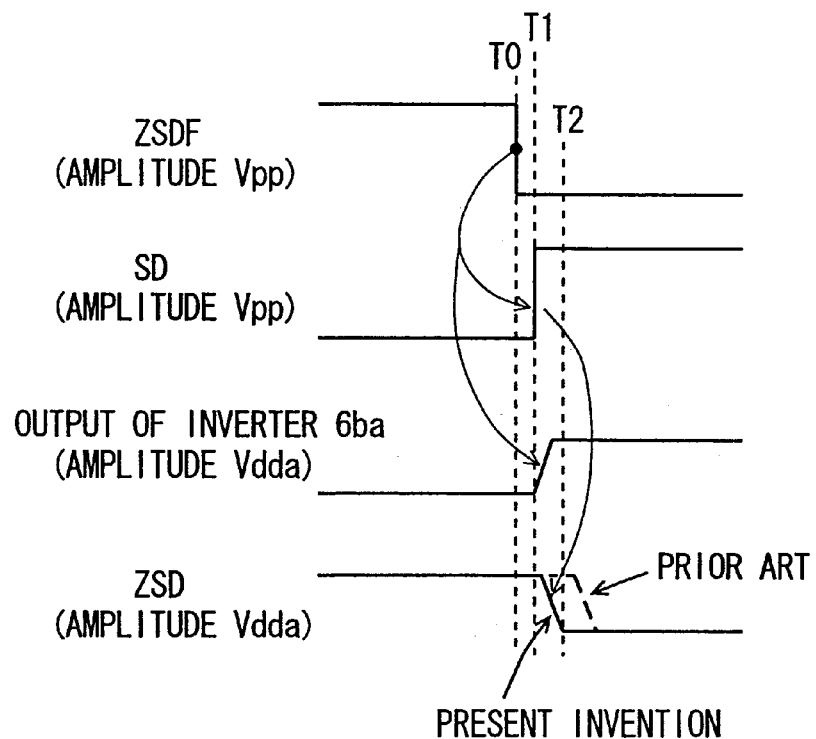
FIG. 4 is a signal waveform diagram representing the operation of an SD generating circuit and a ZSD generating circuit illustrated in FIG. 2.

FIG. 4 is a diagram showing a change in sub decode signal SD more specifically. Referring to FIG. 4, the operation of the sub word line selection signal generating portion will now be described.

At time T0, sub decode first signal ZSDF falls from the high voltage Vpp level to the ground voltage level. When sub decode first signal ZSDF exceeds the input logic threshold voltage of inverter 6aa, the voltage level of sub decode signal SD increases. Inverter 6aa uses high voltage Vpp as an operation power supply voltage and is fast in operation speed. Consequently, sub decode signal SD is driven to the high voltage Vpp level at high speed at time T1.

When sub decode signal SD exceeds the input logic threshold voltage of NOR circuit 6bb, the voltage level of an output signal of NOR circuit 6bb decreases. Although NOR gate 6bb uses array power supply voltage Vdda as an operation power supply voltage, output signal ZSD is driven to the ground voltage level in accordance with sub decode signal SD at the high voltage Vpp level. Specifically, in NOR gate 6bb, the high voltage is applied to the gate of a discharging MOS transistor, and the discharging MOS transistor discharges an output node to the ground voltage level at high speed. Even when the output signal of inverter 6ba does not fully change, complementary sub decode signal ZSD can be driven to the ground voltage level by NOR circuit 6bb. At time T2, complementary sub decode signal ZSD attains the ground voltage level.

As compared with the configuration of further driving the inverter in accordance with an output signal of inverter 6ba and generating complementary sub decode signal ZSD as in the conventional technique, when sub decode signal SD rises, complementary sub decode signal ZSD can be driven to the ground voltage level promptly, and the period in which both sub decode signal SD and complementary sub decode signal ZSD are at the H level can be made extremely short (only an extremely short period determined by response time of NOR circuit 6bb). Therefore, the period in which both MOS transistors Q1 and Q3 are in the on state and a through current flows from the high voltage node of inverter 6aa to the ground node can be made extremely short, so that the current consumption can be reduced.

By reducing the through current, drop in the voltage level of high voltage Vpp can be suppressed, and an accurate memory operation can be guaranteed. Even in an accelerated test such as a burn-in test, a selected sub word line can be driven to a desired voltage level with reliability, and an accelerated test can be performed with accuracy.

It can be also considered that complementary sub decode signal ZSD is generated from sub decode signal SD by an output inverter receiving the array power supply voltage as an operation power supply voltage in place of inverter 6ba and NOR circuit 6bb. With such a configuration, when the voltage level of high voltage Vpp decreases and becomes close to the input logic threshold voltage level of the output inverter, there is the possibility that the voltage level of complementary sub decode signal ZSD from the output inverter rises and becomes higher than the threshold voltage of MOS transistor Q3 of the sub word driver. In this case, complementary sub decode signal ZSD is merely driven to an intermediate voltage level, a through current flows via the sub word driver, the voltage level of high voltage Vpp remains lowered, and an accurate memory cell selecting operation cannot be assured.

By using NOR circuit 6bb, even when the voltage level of high voltage Vpp drops, complementary sub decode signal ZSD can be driven to the ground voltage level with reliability in accordance with a signal from inverter 6ba at the array power supply voltage level. Consequently, such a phenomenon can be prevented from occurring that the drop in the voltage level of high voltage Vpp may causes the voltage level of complementary sub decode signal ZSD to be floating and a through current may flow.

Figure 5:
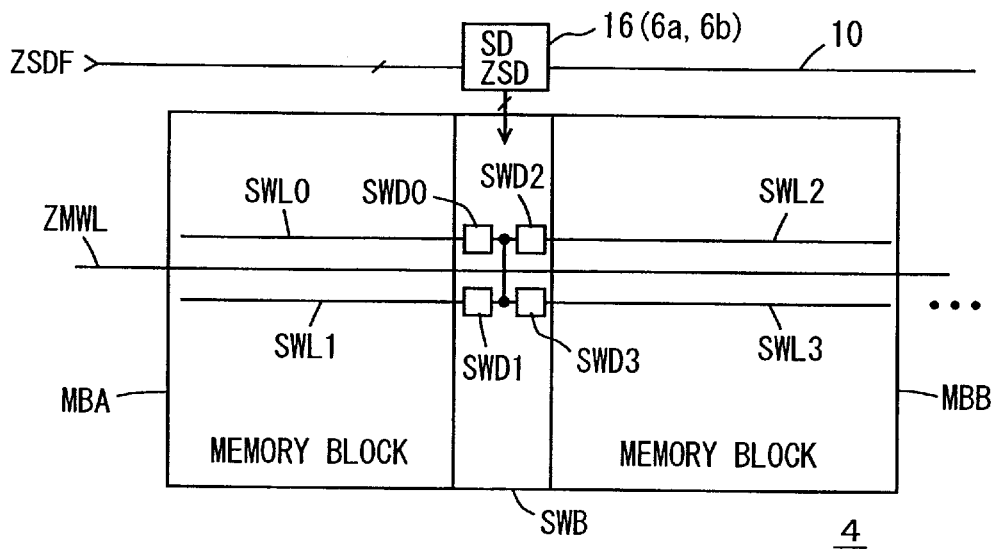
FIG. 5 is a diagram schematically showing the configuration of a memory cell array portion of a semiconductor memory device in the first embodiment of the invention.

FIG. 5 is a diagram schematically showing the configuration of memory cell array 4. In FIG. 5, memory cell array 4 is divided into a plurality of memory blocks. In FIG. 5, two memory blocks MBA and MBB adjacent in the row direction are representatively shown. Between memory blocks MBA and MBB, a sub word driver band SWB in which sub word drivers are arranged is provided. Along memory blocks MBA and MBB, for example in the sense amplifier band, a sub decode signal transmission line (having a width of a plurality of bits) 10 is provided. Through sub decode signal transmission line 10, sub decode first signal ZSDF is transmitted. By transmitting sub decode first signal ZSDF through sub decode signal transmission line 10 arranged in the sense amplifier band, the signal interconnection area can be reduced as compared with the configuration of transmitting complementary sub decode signals SD and ZSD.

In an area where the sense amplifier band and sub word driver band SWB cross each other, a sub decode signal generating circuit 16 is provided. Sub decode signal generating circuit 16 includes SD generating circuit 6a and ZSD generating circuit 6b as shown in FIG. 2. From sub decode signal generating circuit 16, sub decode signals SD and ZSD are applied to sub word drivers SWD provided in sub word driver band SWB.

In memory blocks MBA and MBB, two sub word lines are arranged for one main word line ZMWL. In memory block MBA, sub word lines SWL0 and SWL1 are arranged for main word line ZMWL, and in memory block MBB, sub word lines SWL2 and SWL3 are arranged in correspondence to main word line ZMWL. Sub word lines SWL0 to SWL3 are driven by sub word drivers SWD0 to SWD3, respectively. Respective sub decode signal pairs from sub decode signal generating circuit 16 are supplied to sub word drivers SWD0 to SWD3.

FIG. 6 is a diagram showing an example of the configuration of sub word drivers SWD0 to SWD3 illustrated in FIG. 5. In FIG. 6, sub word drivers SWD0 to SWD3 have the same configuration and each includes P-channel MOS transistor Q1 and N-channel MOS transistor Q2 each receiving the main word line selection signal on main word line ZMWL at their gates and N-channel MOS transistor Q3 receiving sub decode signal ZSD at a gate thereof.

Sub decode signals SD<A> and ZSD<A> are supplied commonly to sub word drivers SWD0 and SWD2. Sub decode signals ZSD<B> and SD<B> are supplied commonly to sub word drivers SWD1 and SWD3. When main word line ZMWL is selected, therefore, sub word drivers SWD0 and SWD2 are simultaneously selected to drive sub word lines SWL0 and SWL2 to the selected state, or sub word drivers SWD1 and SWD3 are selected to drive sub word lines SWL1 and SWL3 simultaneously to the selected state.

Sub decode first signal ZSDF on sub decode signal transmission line 10 therefore includes sub decode first signals ZSDF<A> and ZSDF<B>. The sub decode signals are transmitted to each set of sub word lines provided in correspondence to the main word line in each sub memory block.

In the configuration shown in FIGS. 5 and 6, the number of interconnection lines required for distributing the sub decode first signals to sub word driver band SWB can be reduced. In sub word driver band SWB, on both sides of memory block MB in the row direction, four sub word drivers in a set shown in FIG. 5 is alternately arranged. The pitch condition in the column direction of the sub word drivers can be therefore relaxed and sub word drivers can be arranged with sufficient margin.

Figure 7:
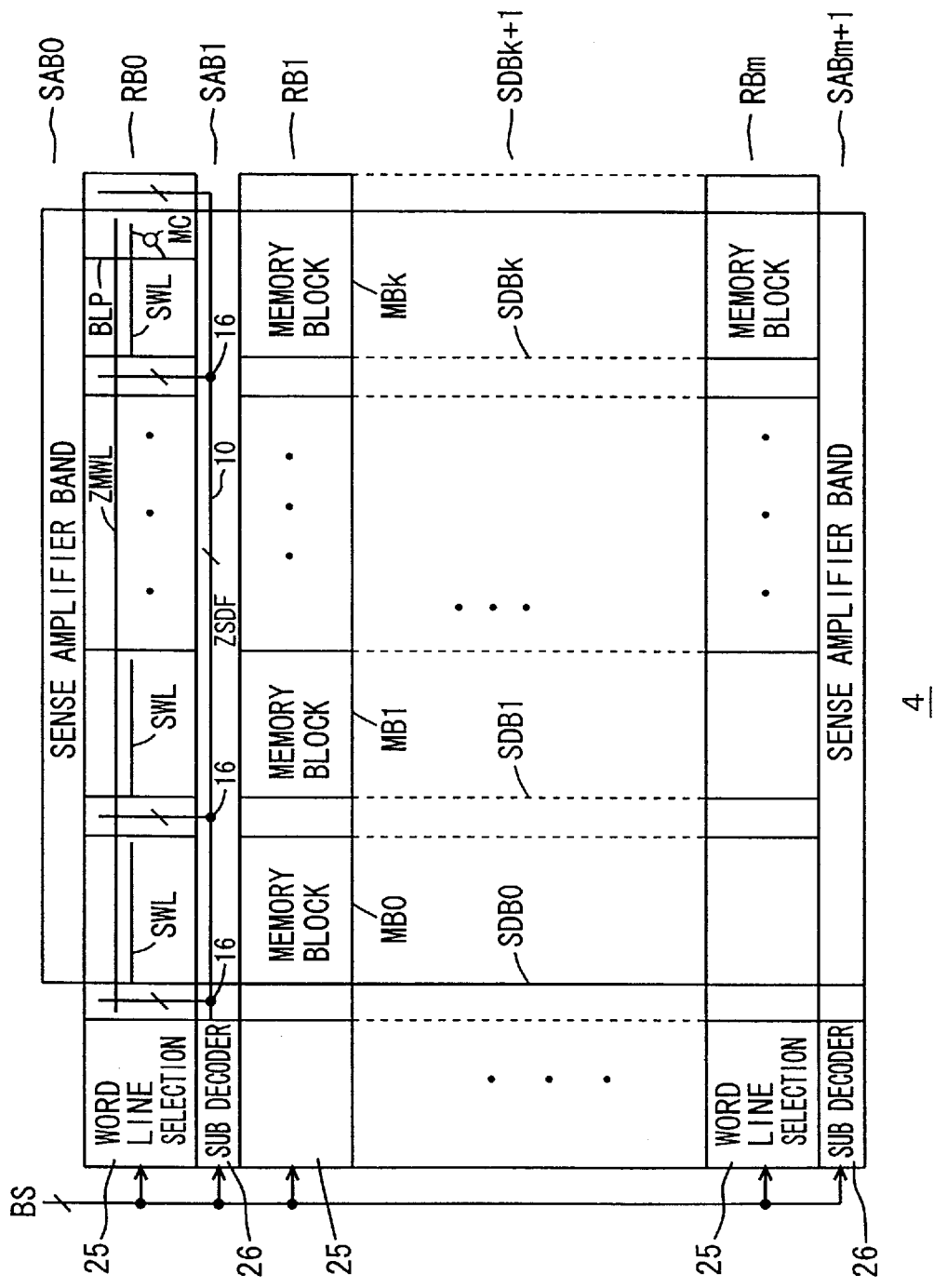
FIG. 7 is a diagram showing the configuration of the memory cell array illustrated in FIG. 1 more specifically.

FIG. 7 is a diagram more specifically showing the configuration of memory cell array 4 of the semiconductor memory device according to the invention. In FIG. 7, memory cell array 4 is divided into a plurality of row blocks RB0 to RBm. Each of row blocks RB0 to RBm includes memory blocks MB0 to MBk arranged in alignment in the row direction. In each of memory blocks MB0 to MBk, sub word line SWL and bit line pair BLP are arranged in correspondence to a memory cell row and a memory cell column, respectively. In correspondence to the intersection of bit line pair BLP and sub word line SWL, a memory cell MC is disposed.

Between row blocks and on the outside of the memory cell array, sense amplifier bands SAB0 to SABm+1 are arranged. Each of sense amplifier bands SAB0 to SABm+1 includes sense amplifier circuits provided for columns (bit line pairs BLP) of memory blocks of corresponding row blocks, and senses, amplifies, and latches data of selected memory cells in a corresponding memory block. Sense amplifier bands SAB1 to SABm (not shown) are shared by row blocks adjacent in the column direction.

Between and on both sides of memory blocks adjacent in the row direction in each of row blocks RB0 to RBm, sub word driver bands SDB0 to SDBk+1 are arranged. In each of sub word driver bands SDB0 to SDBk+1, sub word drivers are arranged in correspondence to memory blocks. A sub word driver is arranged in correspondence to a sub word line of the corresponding memory block. The sub word drivers may be arranged alternately on both sides of memory blocks. The sub word drivers may be arranged alternately in a unit of a plurality of (two) sub word drivers in the row direction.

In each of row blocks RB0 to RBm, main word line ZMWL extending in the row direction is arranged commonly for memory blocks in the corresponding row block. Sub word line SWL is arranged only in the memory block, and is connected to the memory cells of a corresponding row in the corresponding memory block. Sub word line SWL is selectively driven by a sub word driver in a corresponding sub word driver band in accordance with a signal on the corresponding main word line ZMWL and the sub decode signal pair.

A word line selection circuit 25 is arranged for each of row blocks RB0 to RBm. A sub decoder 26 for generating sub decode first signal ZSDF onto sub decode signal transmission line 10 is provided for each of sense amplifier bands SAB1 to SABm+1.

Complementary sub decode signals are generated by sub decode signal generating circuit 16 arranged in correspondence to an intersection between each sub word driver band and sense amplifier band SB in accordance with the sub decode first signal (word line designation signal) on sub decode signal transmission line 10 and are supplied to the sub word drivers in the corresponding row block.

A block selection signal BS is supplied to word line selection circuit 25 and sub decoder 26. On the basis of block selection signal BS, one of row blocks RB0 to RBm is designated and the word line (main and sub word lines) is driven to the selected state only in the selected row block. The block selection signal BS may be so made as to select a plurality of memory blocks simultaneously depending on a memory array configuration.

Reset signal ZRSET shown in FIG. 2 is selectively made inactive in accordance with block selection signal BS and an array activating signal. The array activating signal is a signal which is made active when a row selecting operation is instructed and maintains the active state during the period in which the memory cell selection is performed.

Even in the memory cell array structure of the block divided structure as shown in FIG. 7, by disposing sub decode signal generating circuit 16 in correspondence to the intersection of sense amplifier band SAB and sub word driver band SDB, it is required only to transmit the sub decode first signal for designating a sub word line onto sub decode signal transmission line 10. Thus, the area of the wiring layout can be reduced.

[First Modification]

Figure 8:
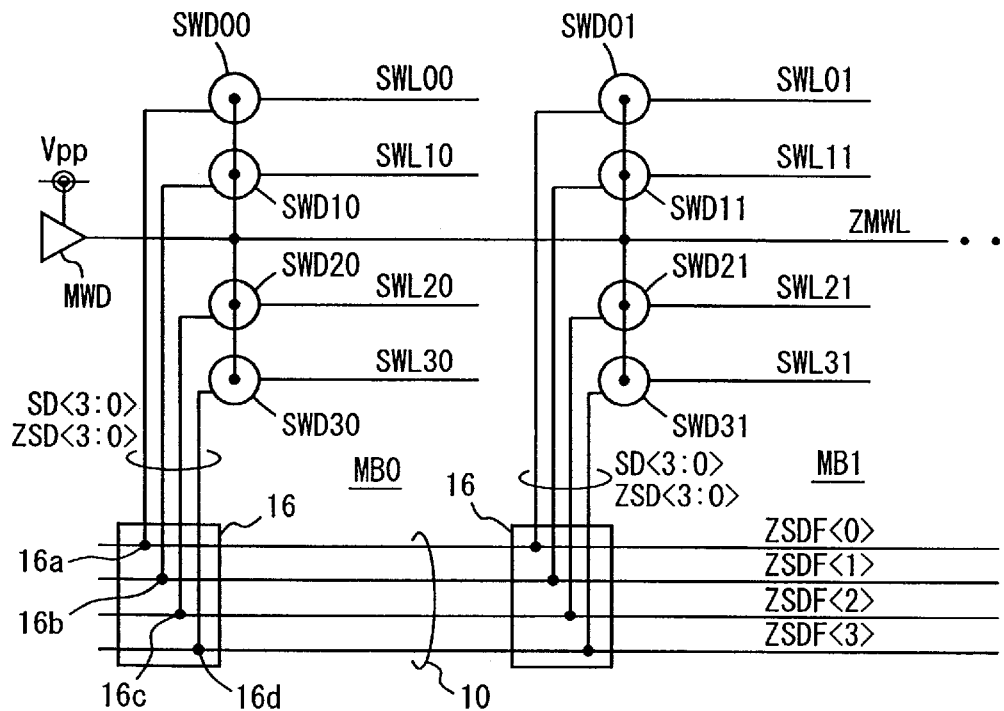
FIG. 8 is a diagram schematically showing the configuration of a first modification of the first embodiment of the invention.

FIG. 8 is a diagram schematically showing the configuration of a first modification of the first embodiment of the invention. In FIG. 8, four sub word lines are arranged for main word line ZMWL in each of memory blocks MB0 and MB1. In memory block MB0, sub word lines SWL00 to SWL30 are arranged for main word line ZMWL. In memory block MB1, sub word lines SWL01 to SWL31 are arranged. In correspondence to sub word lines SWL00 to SWL30 and SWL01 to SWL31, sub word drivers SWD00 to SWD30 and SWD01 to SWD31 are disposed, respectively.

Main word line ZMWL is driven by main word driver MWD receiving high voltage Vpp. Main word driver MWD is arranged in correspondence to each main word line in main word line selection circuit 5 as shown in FIG. 1.

Sub decode signal transmission lines 10 are arranged in the sense amplifier band, and sub decode first signals ZSDF<0> to ZSDF<3> are transmitted in parallel on the sub decode signal transmission line 10 of a plural bit width.

At the intersection (cross band) between the sense amplifier band and the sub word driver band, sub decode signal generating circuit 16 is arranged. Sub decode signal generating circuits 16 include sub decode signal driving circuits 16a to 16d provided in correspondence to sub decode first signals ZSDF<0> to ZSDF<3>, respectively. Each of sub decode signal driving circuits 16a to 16d includes SD generating circuit 6a and ZSD generating circuit 6b shown in FIG. 2 and generates a pair of complementary sub decode signals SD<i> and ZSD<i>, where i=0 to 3.

In the configuration shown in FIG. 8, sub decode signals SD<0>and ZSD<0> are supplied to sub word drivers SWD00 and SWD01. To sub word drivers SWD10 and SWD11, sub decode signals SD<1> and ZSD<1> are supplied. To sub word drivers SWD20 and SWD21, sub decode signals SD<2> and ZSD<2> are supplied. To sub word drivers SWD30 and SWD31, sub decode signals SD<3> and ZSD<3> are supplied.

As shown in FIG. 8, also in a four-way hierarchical word line configuration in which four sub word lines are provided for one main word line in each of memory blocks MB, by generating complementary sub decode signals in accordance with sub decode signal SD, a leak current in the sub word driver can be reduced with reliability. Sub decode first signals ZSDF<0> to ZSDF<3> are generated from predecode signals X<0> to X<3>, respectively. Predecode signals X<0> to X<3> of four bits are generated by decoding row address signals RX0 and RX1 of two bits.

[Second Modification]

Figure 9:
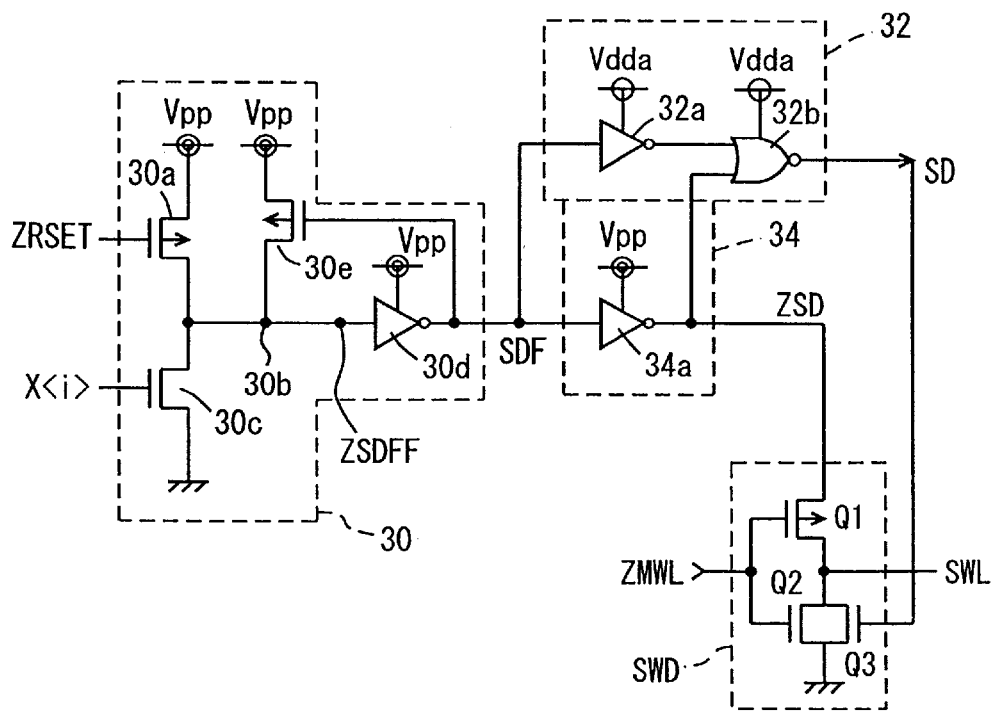
FIG. 9 is a diagram showing the configuration of a second modification of the first embodiment of the invention.
Figure 10:
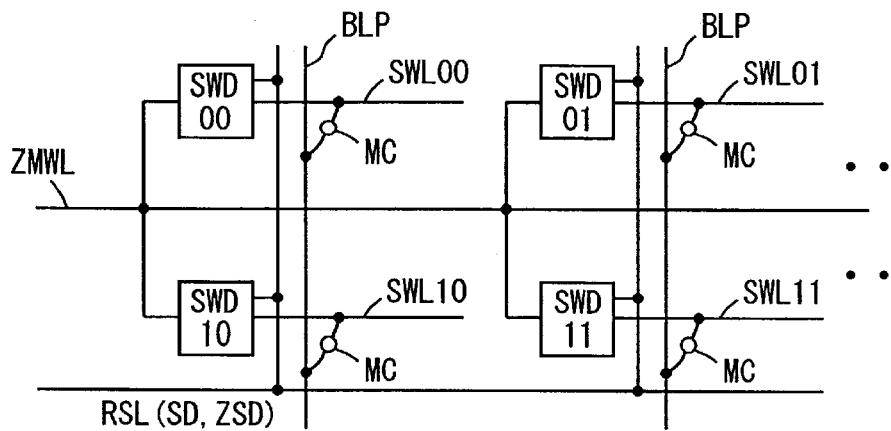
FIG. 10 is a diagram schematically showing the configuration of a memory cell array portion of a conventional semiconductor memory device.

FIG. 9 is a diagram showing the configuration of a second modification of the first embodiment of the invention. In FIG. 9, sub decode signal SD has an amplitude of the array power supply voltage Vdda level, and complementary sub decode signal ZSD has an amplitude of the high voltage Vpp level. In sub word driver SWD, complementary sub decode signal ZSD is supplied to P-channel MOS transistor Q1, and sub decode signal SD is supplied to the gate of the N-channel MOS transistor Q3.

In order to generate sub decode signals SD and ZSD, there are provided: a sub decoder 30 for decoding predecode signal X<i> and generating sub decode first signal SDF; a ZSD generating circuit 34 for generating complementary sub decode signal ZSD in accordance with sub decode first signal SDF from sub decoder 30; and an SD generating circuit 32 for generating sub decode signal SD in accordance with complementary sub decode signal ZSD and sub decode first signal SDF.

Sub decoder 30 includes: a P-channel MOS transistor 30a connected between a high voltage node and an internal node 30b, and receiving reset signal ZRSET at a gate thereof; an N-channel MOS transistor 30c connected between node 30b and the ground node, and receiving predecode signal X<i> at a gate thereof; an inverter 30d for inverting decode signal ZSDFF at node 30b to generate sub decode first signal SDF; and a P-channel MOS transistor 30e for selectively charging internal node 30b to the high voltage Vpp level in accordance with sub decode first signal SDF output from inverter 30d. Inverter 30d receives high voltage Vpp as an operation power supply voltage and therefore, sub decode first signal SDF is a signal having an amplitude of the high voltage Vpp level.

The configuration of sub decoder 30 shown in FIG. 9 is similar to that of sub decoder 6c shown in FIG. 2 except that inverter 6cf at the output stage is not provided. When predecode signal X<i> is in the selected state, sub decode first signal SDF is driven to the high voltage Vpp level. On the other hand, when predecode signal X<i> is at the L level and is in the non-selected state, sub decode first signal SDF is at the L level.

Reset signal ZRSET is set to the L level in the active state in the standby state.

SD generating circuit 32 includes: an inverter 32a receiving sub decode first signal SDF; and an NOR gate 32b receiving an output signal of inverter 32a and complementary sub decode signal ZSD. Each of inverter 32a and NOR gate 32b receives array power supply voltage Vdda as an operation power supply voltage.

ZSD generating circuit 34 includes an inverter 34a for inverting sub decode first signal SDF to generate complementary sub decode signal ZSD. Inverter 34a receives high voltage Vpp as an operation power supply voltage. Sub decode signal ZSD is therefore a signal having an amplitude of the high voltage Vpp level.

In the configuration shown in FIG. 9, when sub decode signal ZSD is at the H level (high voltage Vpp level), sub word line SWL is driven to the high voltage Vpp level (when main word line ZMWL is selected and is at the L level).

When sub decode signal ZSD rises to the high voltage Vpp level, an output signal of NOR gate 32b goes low at high speed, and MOS transistor Q3 is turned off at high speed. Similar to the configuration shown in FIG. 2, the period in which a path through which a through current flows from the high voltage node to the ground node via MOS transistors Q1 and Q3 is formed can be sufficiently shortened, and current consumption can be reduced.

When sub decode signal ZSD is at the L level, sub decode signal SD is at the H level (array power supply voltage Vdda level), MOS transistor Q3 is turned on, and sub word line SWL is maintained at the ground voltage level.

As shown in FIG. 9, therefore, also in the configuration of using sub decode first signal SDF, the sub decode signal transmitted to the selected sub word line has an amplitude at the high voltage Vpp level. When sub word line SWL rises to high voltage Vpp level, NOR gate 32b drives its output signal SD to the ground voltage level at high speed. This is because in NOR gate 32b, the driving capability of the MOS transistor receiving high voltage Vpp at its gate increases and the output node for outputting sub decode signal SD is driven to the ground voltage level at high speed.

Therefore, also by using the configuration as shown in FIG. 9, similarly, the through current in the word driver can be suppressed, and current consumption can be reduced. In addition, high voltage Vpp can be transmitted to a selected sub word line with reliability, and a memory cell can be accurately driven to the selected state.

[Other Application Examples]

As the hierarchical word line structure (divided word line structure), an eight-way hierarchical word line structure in which eight sub word lines are provided in each memory block for one main word line may be used.

Sub word drivers may be arranged alternately with respect to the sub word lines in the sub word driver band.

Although the selected main word line is driven to the ground voltage level in the above description, a configuration in which the selected main word line is driven to the high voltage Vpp level may be also employed.

A non-selected sub word line is driven to the ground voltage level in the above description. However, a negative voltage word line scheme in which the non-selected sub word line is driven to a negative voltage level for reducing a leak current of an access transistor in a memory cell may be also used.

As described above, according to the invention, from one of sub decode signals, the other sub decode signal is generated. Therefore, the state of the other sub decode signal can be changed in accordance with a change in the sub decode signal, so that the period in which a through current flowing path in the sub word driver is formed is made sufficiently short. Consequently, current consumption can be reduced, and the voltage level of the selected sub word line can be accurately driven to a desired voltage level, so that memory cell selecting operation or an accelerated test can be accurately carried out.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device of a hierarchical word line structure having main word lines and sub word lines, a plurality of sub word lines being arranged for the main word line, comprising:

a decoding circuit for generating a sub decode first signal for specifying one of the sub word lines arranged in correspondence to the main word line in accordance with an address signal;

a first driving circuit receiving a first voltage as an operation power supply voltage and generating a first sub decode signal in accordance with said sub decode first signal;

a second driving circuit receiving a second voltage as an operation power supply voltage and generating an internal sub decode signal in accordance with said sub decode first signal; and a gate circuit for receiving said second voltage as an operation power supply voltage and generating a second sub decode signal complementary to said first sub decode signal in accordance with output signals of the first and second driving circuits, one of said plurality of sub word lines arranged corresponding to the main word line being designated in accordance with the first and second sub decode signals.

2. The semiconductor memory device according to claim 1, wherein said first voltage is higher than said second voltage.

3. The semiconductor memory device according to claim 1, wherein said gate circuit generates a signal at a first logical level when at least one of said first sub decode signal and said internal sub decode signal is at a second logical level.

4. The semiconductor memory device according to claim 1, wherein said gate circuit operates as an inverter when said first sub decode signal is at a first logical level.

5. The semiconductor memory device according to claim 1, wherein said first sub decode signal is transmitted onto a corresponding sub word line when selected.

6. A semiconductor memory device comprising:

a plurality of memory cells arranged in rows and columns;

a plurality of sub word lines, arranged in correspondence to said rows of memory cells, each connecting to memory cells of a corresponding row;

a plurality of main word lines arranged in correspondence to a predetermined number of sub word lines;

main word line selecting circuitry for driving a main word line of said plurality of main word lines to a selected state in accordance with a first address signal;

sub decode circuitry for generating a sub decode first signal for selecting a sub word line of said predetermined number of sub word lines in accordance with a second address signal;

sub decode driving circuitry for generating pairs of complementary sub decode signals in accordance with said sub decode first signal, said sub decode driving circuitry including, for each pair of complementary sub decode signals, a first driving circuit receiving a first voltage as an operation power supply voltage and generating a first sub decode signal in accordance with said sub decode first signal, a second driving circuit receiving a second voltage as an operation power supply voltage and generating an internal sub decode signal in accordance with said sub decode first signal, and a gate circuit receiving said second voltage as an operation power supply voltage and generating a second sub decode signal complementary to said first sub decode signal in accordance with output signals of the first and second driving circuit, one of the predetermined number of sub word lines being designated in accordance with the first and second sub decode signals; and sub word drivers, arranged corresponding to the sub word lines, each receiving a corresponding pair of complementary sub decode signals and driving a corresponding sub word line to a selected state in accordance with a signal on a corresponding main word line and the corresponding pair of complementary sub decode signals from said sub decode driving circuitry.

7. The semiconductor memory device according to claim 6, wherein said pairs of complementary sub decode signals is generated in correspondence to each of said predetermined number of sub word lines, and each of said sub word drivers comprises:

a first transistor for transmitting a corresponding first sub decode signal to a corresponding sub word line in accordance with a signal on the corresponding main word line;

a second transistor for driving said corresponding sub word line to a non-selected state in accordance with a corresponding second sub decode signal; and a third transistor for driving said corresponding sub word line to a non-selected state in accordance with a signal on said corresponding main word line.

8. The semiconductor memory device according to claim 7, wherein said plurality of memory cells are divided into a plurality of memory blocks along a row direction, said plurality of sub word lines are arranged in correspondence to the rows of memory cells in each of said memory blocks, and said sub decode driving circuitry is arranged corresponding to at least an area between adjacent memory blocks in the row direction in said plurality of memory blocks.

9. The semiconductor memory device according to claim 6, wherein said pairs of complementary sub decode signals are generated in correspondence to each of said predetermined number of sub word lines, said gate circuit is arranged in correspondence to each pair of the complementary sub decode signal, and includes a logic gate receiving a corresponding first sub decode signal and a corresponding internal sub decode signal and sets, when both said corresponding first sub decode signal and internal sub decode signal are at the first logic level, a corresponding second internal sub decode signal at a second logic level for driving the corresponding sub word line to a non-selected state.

10. The semiconductor memory device according to claim 9, wherein said logic gate is a negative logical sum circuit.

* * * * *